United States Patent
Sie et al.

(10) Patent No.: US 10,861,995 B2
(45) Date of Patent: Dec. 8, 2020

(54) FAST TOPOLOGICAL SWITCH USING STRAINED WEYL SEMIMETALS

(71) Applicant: The Board of Trustees of the Leland Stanford Junior University, Stanford, CA (US)

(72) Inventors: Edbert J. Sie, Stanford, CA (US); Clara M. Nyby, Stanford, CA (US); Sri C D Pemmaraju, Stanford, CA (US); Xijie Wang, Stanford, CA (US); Aaron M. Lindenberg, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 16/559,331

(22) Filed: Sep. 3, 2019

(65) Prior Publication Data

US 2020/0075790 A1    Mar. 5, 2020

Related U.S. Application Data

(60) Provisional application No. 62/726,893, filed on Sep. 4, 2018.

(51) Int. Cl.
*H01L 31/09* (2006.01)
*H01L 49/00* (2006.01)
*H01L 31/032* (2006.01)

(52) U.S. Cl.
CPC .......... *H01L 31/09* (2013.01); *H01L 31/032* (2013.01); *H01L 49/00* (2013.01)

(58) Field of Classification Search
CPC ....... H01L 31/09; H01L 31/032; H01L 49/00; G01J 1/00; G01J 1/04; G01J 1/44
See application file for complete search history.

(56) References Cited

U.S. PATENT DOCUMENTS

| | | | |
|---|---|---|---|
| 9,024,415 B2 | 5/2015 | Zhang et al. | |
| 9,837,483 B2 | 12/2017 | Gilbert et al. | |
| 2003/0012115 A1* | 1/2003 | Akiyama | G11B 7/1275 369/112.02 |
| 2017/0138844 A1 | 5/2017 | Xu et al. | |
| 2018/0026185 A1 | 1/2018 | Chan et al. | |
| 2018/0087178 A1 | 3/2018 | Zhang et al. | |
| 2019/0378977 A1* | 12/2019 | Wu | H01L 45/1226 |

OTHER PUBLICATIONS

Tsipas et al, "Direct Observation at Room Temperature of the Orthorhombic Weyl Semimetal Phase in Thin Epitaxial MoTe2", Adv. Funct Mater. 2018 (Year: 2018).*
Cho et al, "Phase Patterning for Ohmic Homojunction Contact in MoTe2", Science vol. 349 Issue 6248, p. 625-626, 2015 (Year: 2015).*
Zhang et al, Light-Induced Sub-Picosecond Topological Phase Transitions in MoTe2, Phys. Rev. X, 9, 021036 2019 (Year: 2019).*

* cited by examiner

*Primary Examiner* — David E Smith
(74) *Attorney, Agent, or Firm* — Foley & Lardner LLP

(57) ABSTRACT

A method of operating a device includes: (1) providing a film of a semimetal in a first topological phase; and (2) inducing interlayer shear oscillation of the semimetal within the film, wherein the interlayer shear oscillation induces the semimetal to transition to a different, second topological phase.

17 Claims, 9 Drawing Sheets

US 10,861,995 B2

FAST TOPOLOGICAL SWITCH USING STRAINED WEYL SEMIMETALS

CROSS-REFERENCE TO RELATED APPLICATIONS

This application claims the benefit of U.S. Provisional Application No. 62/726,893, filed Sep. 4, 2018, the contents of which are incorporated herein by reference in their entirety.

STATEMENT REGARDING FEDERALLY SPONSORED RESEARCH OR DEVELOPMENT

This invention was made with Government support under contract DE-AC02-76SF00515 awarded by the Department of Energy. The Government has certain rights in the invention.

TECHNICAL FIELD

The present disclosure relates to an ultrafast topological switch and more particularly to using time-varying shear strain as an ultrafast topological switch using a Weyl semimetal.

BACKGROUND

Topological quantum materials possess some of the most fascinating properties of matter. Such a material features a protected metallic state at the boundaries of the material where an electron's spin and momentum are locked to each other, resembling chiral edge modes in quantum Hall systems. The chiral states are protected from backscattering and localization, with applications for, by way of example, dissipation-less electronics and fault-tolerant quantum computers. Such a system also provides a platform to pursue exotic physics from the seemingly distant field of particle physics in condensed matter systems such as Weyl fermions, which has led to significant efforts focused on discovering topological quantum materials.

Manipulating the topological invariants in the topological quantum materials may allow for topological switching applications analogous to switching of transistors, for obtaining nonequilibrium Floquet topological phases in materials, and for exploring effective gauge fields driven by space- and time-dependent strains. Lattice strain provides a mechanism to tune topological transitions, as it directly modifies the electron-ion interactions and potentially alters the underlying crystalline symmetry on which the topological properties depend. However, inducing large strains in bulk crystals or thin films is not conducive to time-domain modifications. It is therefore desirable to find ways to introduce volume-preserving lattice deformations that can influence the topological invariants rapidly and energy efficiently.

SUMMARY

In some embodiments, a method of operating a device includes: (1) providing a film of a semimetal in a first topological phase; and (2) inducing interlayer shear oscillation of the semimetal within the film, wherein the interlayer shear oscillation induces the semimetal to transition to a different, second topological phase.

In additional embodiments, a device includes: (1) a film of a semimetal; and (2) a light source optically coupled to the film and configured to emit a set of light pulses having a field strength sufficient to induce interlayer shear oscillation of the semimetal within the film.

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

DETAILED DESCRIPTION

Figures 1A, 1B, 1C, 1D, 1E, 1F:
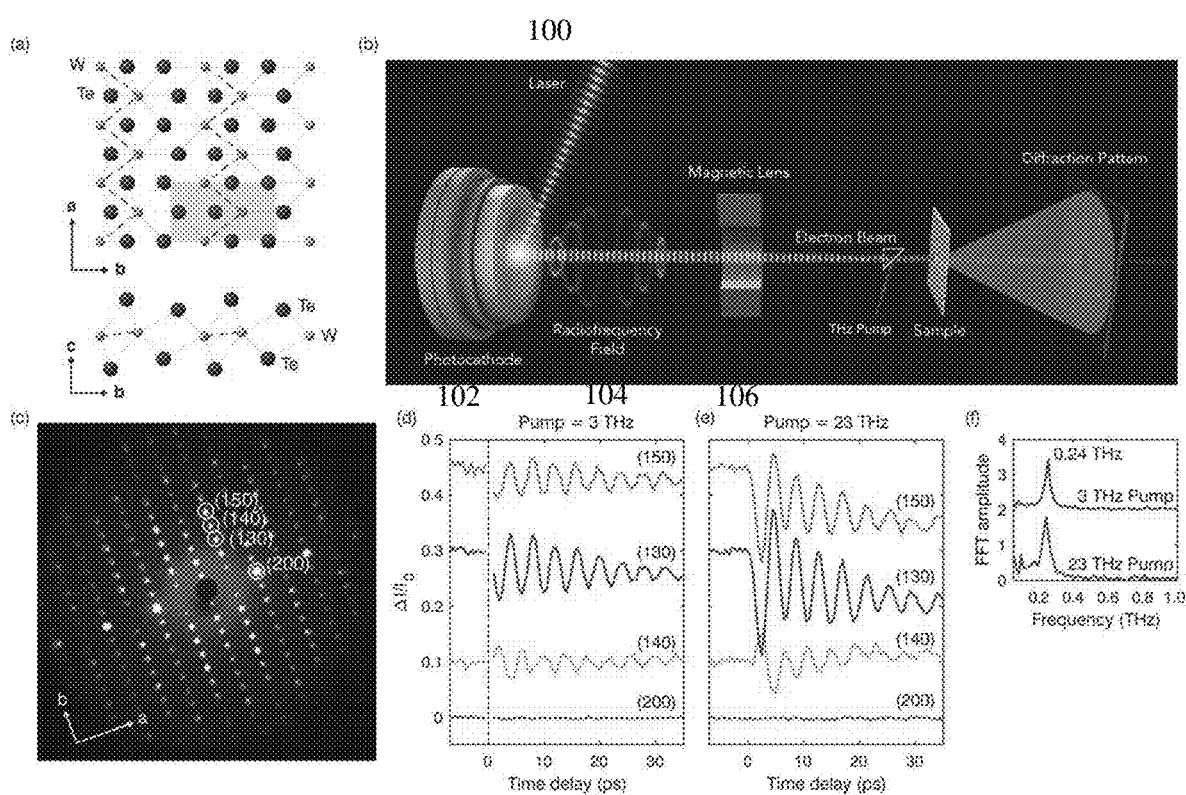
FIG. 1a illustrates a lattice structure of orthorhombic $WTe_2$ ($Td$-$WTe_2$) from a top view (a-b plane) and a side view (b-c plane).
FIG. 1b schematically illustrates a relativistic ultrafast electron diffraction setup.
FIG. 1c illustrates a measured diffraction pattern of $WTe_2$ at equilibrium.
FIG. 1d illustrates Bragg peak intensity changes as a function of time delay between about 3 THz pump pulses and an electron beam.
FIG. 1e illustrates Bragg peak intensity changes as a function of time delay between about 23 THz pump pulses and an electron beam.
FIG. 1f illustrates amplitude of oscillations, indicating a shear phonon mode along a b-axis.

Common reference numerals are used throughout the drawings and the detailed description to indicate the same or similar components. Embodiments of the present disclosure will be readily understood from the following detailed description taken in conjunction with the accompanying drawings.

Various embodiments of the present disclosure are discussed in detail below. It should be appreciated, however, that the embodiments set forth many applicable concepts that can be embodied in a wide variety of specific contexts. It is to be understood that the following disclosure provides many different embodiments or examples of implementing different features of various embodiments. Specific examples of components and arrangements are described below for purposes of discussion. These are, of course, merely examples and are not intended to be limiting.

Embodiments, or examples, illustrated in the drawings, are disclosed below using specific language. It will nevertheless be understood that the embodiments and examples are not intended to be limiting. Any alterations and modifications of the disclosed embodiments, and any further applications of the principles disclosed in this disclosure, as would normally occur to one of ordinary skill in the pertinent art, fall within the scope of this disclosure.

In addition, the present disclosure may repeat reference numerals and/or letters in the various examples. This repetition is for the purpose of simplicity and clarity and does not in itself dictate a relationship between the various embodiments and/or configurations discussed.

According to at least some embodiments of the present disclosure, manipulation of topological invariants in quantum materials may be used for topological switching applications and may stabilize emergent topological phases in otherwise trivial materials. Although lattice strain may be used as a mechanism of tuning these topological invariants, the manner of applying strain through heteroepitaxial lattice mismatch and dislocations are not extendable to controllable time-varying protocols. In particular, integration into a functional device may go beyond the robust, topologically protected properties and discover ways to engineer and manipulate the topology of materials at high speeds. By this disclosure, it is determined that significant strain amplitudes in topological materials can be modulated on ultrafast timescales. Hereby this disclosure describes a femtosecond-resolution crystallographic measurement performed using relativistic electron diffraction on a Weyl semimetal, $WTe_2$. It is demonstrated that terahertz (THz) light pulses can be used to induce interlayer shear oscillations at about 0.24 THz with about 1% (or greater) large strain amplitudes, leading to a topologically distinct metastable phase. Separate nonlinear optical measurements show that this transition is associated with a symmetry change from a non-centrosymmetric to centrosymmetric structure and therefore corresponds to a topological phase transition to a trivial phase. Such shear strain may serve as an ultrafast, energy-efficient mechanism to induce more robust, well-separated Weyl points or to annihilate all Weyl points of opposite chirality. Quasiparticle excitations around Weyl points correspond to massless fermions that are electrically charged, even at room temperatures. Such a system may provide ultrafast manipulation of the topological properties in solids and for a topological switch operating at, for example, THz frequencies.

In other words, THz-induced interlayer shear strain can be used to modulate topological invariants of Weyl semimetals, leading to significant motion of the Weyl points and a long-lived ultrafast switch to a structure with topologically distinct phase. Such a system may enhance control over the topological properties of matter through field-driven lattice deformations. Such systems may be used as, or in, transistors, resistors, magnetic memories, integrated circuits, interconnects, THz electronics, superlenses (e.g., for STM (Scanning tunneling microscope) and/or transistors), and so forth. Such systems can also be utilized as components for optical devices, such as lasers, waveguides, photovoltaic devices, optical detectors, optical modulators, optical frequency harmonics, and so forth.

Interlayer Shear Atomic Displacements in Semimetal Measured using Ultrafast Electron Diffraction In some embodiments, volume-preserving lattice deformations are introduced to influence the topological invariants rapidly and energy efficiently. For example, large amplitude interlayer shear displacements in $WTe_2$ are performed using femtosecond-resolution electron diffraction. FIGS. 1a-1f illustrates coherent interlayer shear displacements in $WTe_2$ measured using relativistic ultrafast electron diffraction. FIG. 1a illustrates a lattice structure of orthorhombic $WTe_2$ (also referred to as $Td-WTe_2$) from a top view (a-b plane) and a side view (b-c plane). The dashed lines indicate the W-W zigzag chain along the a-axis. The shaded area in FIG. 1a shows the unit cell.

As shown in FIG. 1a, $WTe_2$ is a layered transition-metal dichalcogenide (TMD) that crystallizes in a distorted hexagonal net with an orthorhombic (Td) unit cell. The tungsten atoms dimerize along the crystallographic a-axis and form an array of quasi-1D (one-dimensional) metallic chains, and with different layers extending along the crystallographic c-axis. The lack of inversion symmetry in this phase leads to a topological semimetal that was predicted and experimentally verified with type-II Weyl points (WPs), which can be manipulated through atomic-scale lattice distortions. Here, the measured shear displacement amplitudes (about 1%) are more than sufficient to undergo a complete annihilation of the WPs or a more than two-fold increased WP separation, depending on the direction of the shear displacement. Other crystals may start to fracture at these strains and comparative ways of using piezoelectric transducers to induce lattice distortions merely reach about 0.05% strain. The observed large strain described herein is realized by using light to generate interlayer shear strain in a weakly van der Waals-bonded 2D (two-dimensional) TMD, a method that is less susceptible to lattice damage but can significantly alter the electronic band structure.

A relativistic ultrafast electron diffraction (UED) technique is used as a probe to reconstruct the shear motion and crystallographically quantify the corresponding atomic displacements by measuring more than 200 Bragg peaks. FIG. 1b schematically illustrates an about 3-MeV relativistic ultrafast electron diffraction setup. The electron beam is generated using ultraviolet femtosecond laser pulses (generated by a laser 100) at a photocathode 102 and accelerated using intense radiofrequency field from a linear-beam vacuum tube 104 (klystron). A set of magnetic lenses 106 are used to steer and focus the beam onto the sample with a spot size of about 100 μm. The diffracted electron beam is used to probe the structural changes of the sample. Intense THz pump pulses are used to induce interlayer shear strain in WTe$_2$.

In some embodiments, two different THz pump excitation schemes may be used, involving a quasi-single cycle excitation at about 3 THz and a few-cycle excitation at about 23 THz, both of which allow application of an all-optical bias field while minimizing interband transitions. The arrival time of the electron beam (probe) can be adjusted with respect to the THz pulses (pump) using an optical delay stage.

FIG. 1c illustrates a measured diffraction pattern of WTe$_2$ at equilibrium. The measured diffraction pattern in equilibrium as shown in FIG. 1c is consistent with the orthorhombic phase of WTe$_2$ (shown in FIG. 1a), where the W-W chain direction is along the crystallographic a-axis with a shorter unit cell. Under applied THz pump pulses, the intensities of many Bragg peaks are modulated, indicating structural changes in the WTe$_2$ lattice.

To investigate the lattice dynamics, the intensity changes $\Delta I/I_0$ of several Bragg peaks are plotted as a function of time delay $\Delta t$ between the THz pump and electron probe pulses. FIG. 1d illustrates Bragg peak intensity changes as a function of time delay between 3 THz pump pulses and the electron beam. FIG. 1e illustrates Bragg peak intensity changes as a function of time delay between 23 THz pump pulses and the electron beam.

FIG. 1f illustrates FFT (fast Fourier transform) amplitude of oscillations, indicating an about 0.24 THz shear phonon mode along the b-axis. The time traces show coherent oscillations with a frequency of about 0.24 THz (as shown in FIG. 1f), which is consistent with a low frequency interlayer shear mode predicted by density functional theory (DFT) analysis.

Figures 2A, 2B, 2C, 2D, 2E, 2F:
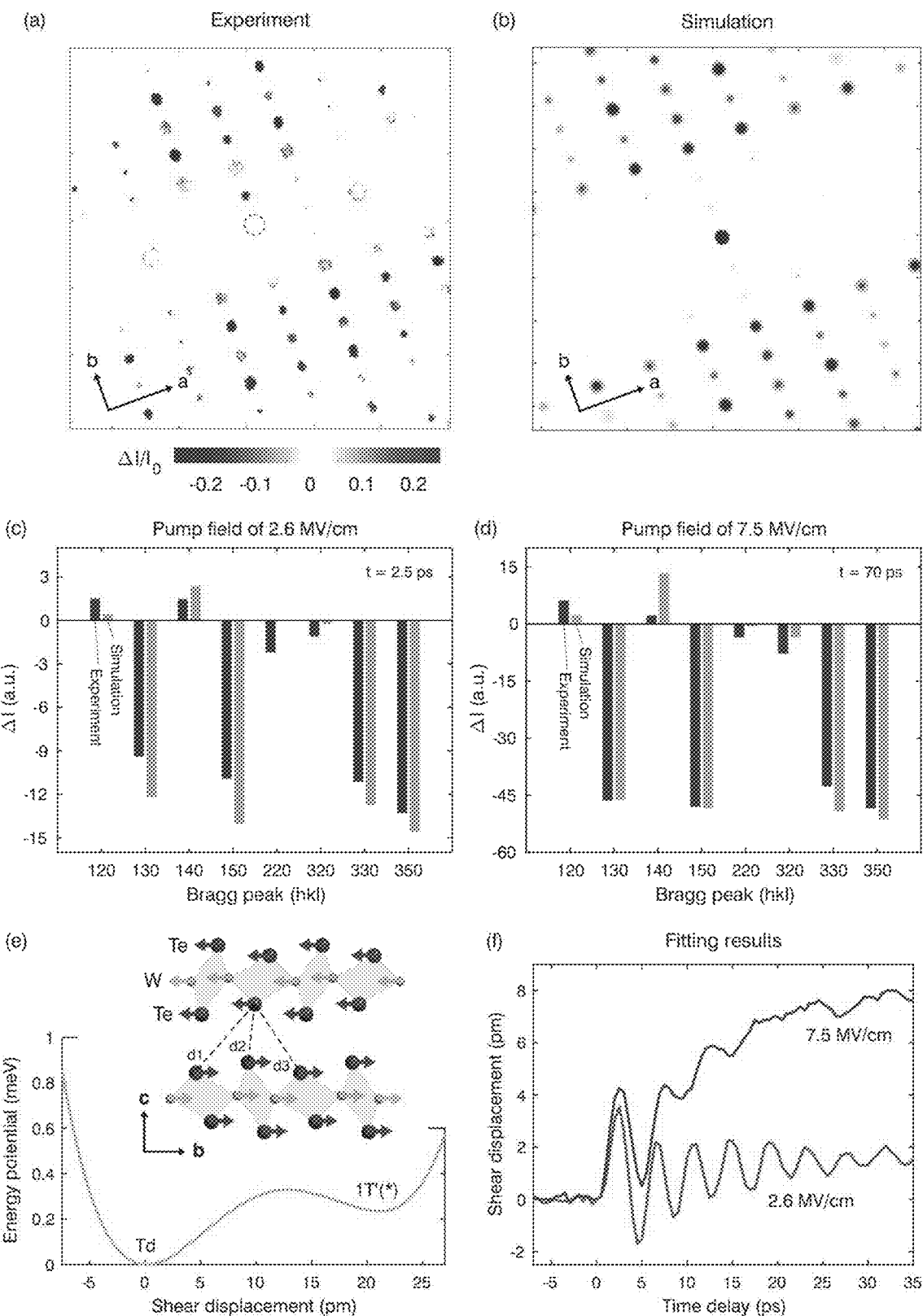
FIG. 2a illustrates measured diffraction intensity changes at about 2.5 ps using pump frequency of about 23 THz.
FIG. 2b illustrates simulated diffraction intensity changes by rigidly displacing adjacent $WTe_2$ layers relative to each other (shear) along the b-axis.
FIG. 2c illustrates a bar chart showing peak intensity modulation $\Delta I$ fitting results between experiment and simulation to obtain shear replacement $\Delta y$ at pump field of about 2.6 MV/cm ($\Delta t$=about 2.5 ps).
FIG. 2d illustrates a bar chart showing peak intensity modulation $\Delta I$ fitting results between experiment and simulation to obtain shear replacement $\Delta y$ at pump field of about 7.5 MV/cm ($\Delta t$=about 70 ps).
FIG. 2e illustrates an energy potential as a function of interlayer shear displacement.
FIG. 2f illustrates shear displacements as a function of time delay at various pump fields, obtained through global fitting of Bragg peak intensity changes.

FIGS. 2a-2f illustrate determination of interlayer shear atomic displacements in WTe$_2$. FIG. 2a illustrates measured diffraction intensity changes at about 2.5 ps (picosecond) using pump frequency of about 23 THz. The alternating sign changes along the b-axis are signatures of shear displacements along the b-axis as shown in the inset of FIG. 2e. To determine the atomic motion, the measured $\Delta I/I_0$ image is plotted at about 2.5 ps (as shown in FIG. 2a). The changes in peak intensity alternate along the b-axis, while peaks (hkl) with k=0 show negligible changes. This indicates that the interlayer shear displacement is along the b-axis. To verify this, the peak intensity modulation $\Delta I/I_0$ is derived by introducing a top layer shear displacement $\Delta y$ with respect to the bottom layer into the structure factor:

$$S(\Delta y) = \exp(-i2\pi k \Delta y) \sum_{top} f_j \exp(-i2\pi(hx_j + ky_j)) + \qquad (1)$$

$$\sum_{bottom} f_j \exp(-i2\pi(hx_j + ky_j))$$

$$= 2 \sum_{top} f_j \cos(2\pi(hx_j + ky_j) + \pi k \Delta y)$$

where the underlying crystalline symmetry in WTe$_2$ is used to obtain the expression. Here, the summation runs over all atoms in the top half of the unit cell (2 W and 4 Te), $f_j$ is the atomic scattering factor, ($x_j\hat{a}$, $y_j\hat{b}$, $z_j\hat{c}$) is the atom position in the unit cell, hk0 are the usual Miller indices for zone axis, and the lattice constants are a=3.477 Å, b=6.249 Å, c=14.018 Å.

FIG. 2b illustrates simulated diffraction intensity changes by rigidly displacing the adjacent WTe$_2$ layers relative to each other (shear) along the b-axis. For comparison, the peak intensity modulation $\Delta I \propto |S(\Delta y)|^2 - |S(0)|^2$ is calculated and plotted in FIG. 2b. Here, a positive shear displacement ($\Delta y > 0$) is specified as shown in the inset of FIG. 2e. The simulated image shows an agreement with the measured image and verifies that the peak intensity modulation arises primarily from interlayer shear displacement along the b-axis.

The shear displacement amplitude is determined through a global fitting of many Bragg peaks between the simulated and the measured intensities as a function of time delay. FIG. 2c illustrates a bar chart showing $\Delta I$ fitting results between experiment and simulation to obtain $\Delta y$ at pump field of about 2.6 MV/cm ($\Delta t$=about 2.5 ps). FIG. 2d illustrates a bar chart showing $\Delta I$ fitting results between experiment and simulation to obtain $\Delta y$ at pump field of about 7.5 MV/cm ($\Delta t$=about 70 ps). The fitting results are compared in the bar charts of FIGS. 2c and 2d, showing that the proposed interlayer shear displacement fits the experimental data well.

FIG. 2e illustrates an energy potential as a function of interlayer shear displacement, using DFT calculation. The schematic shows an interlayer shear motion along with positive displacement, namely towards $d_1 < d_3$.

FIG. 2f illustrates shear displacements as a function of time delay at pump fields of about 2.6 MV/cm and about 7.5 MV/cm, obtained through global fitting of many Bragg peak intensity changes. At low pump field of about 2.6 MV/cm (about 23 THz), the fitting results show shear displacements that oscillate between about −1.7 to about +3.6 pm in the early stage and gradually develop an offset toward positive shear displacement of about +1.5 pm in the later stage. Increasing the pump field to about 7.5 MV/cm leads to a much larger offset of about +8.0 pm (about 1.3% strain) that gradually builds up on a timescale of about 25 ps and persists longer than about 70 ps. The long-lived offset, particularly at high pump field, indicates that the lattice has found a new equilibrium position, deviating from a normal harmonic oscillator behavior.

Figures 11A, 11B:
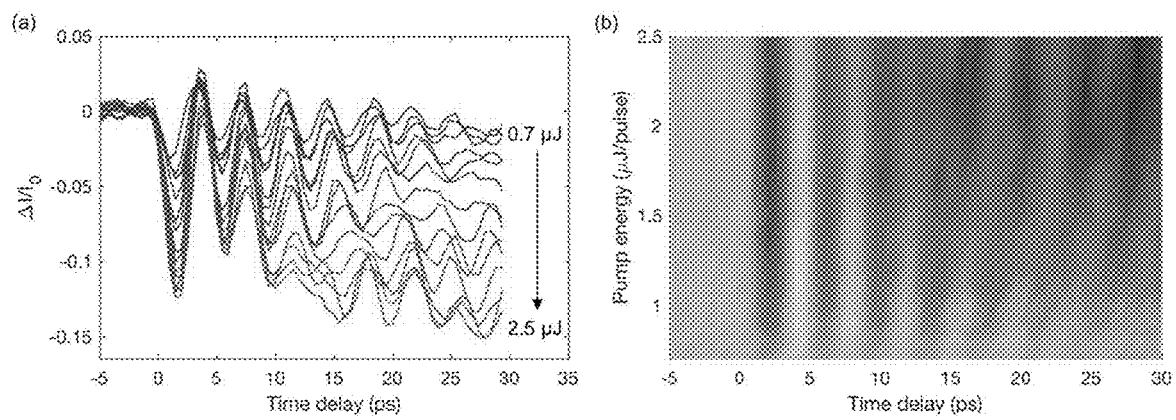
FIG. 11a illustrates intensity changes of a Bragg peak corresponding to interlayer shear oscillation that exhibits a phonon softening at larger pump fluences.
FIG. 11b illustrates a surface plot where peak intensity modulation $\Delta I/I_0$ is represented by pixel scales.

Additional measurements show that the shear oscillation frequency softens at increasing field strengths (as shown in FIGS. 11a and 11b), consistent with an anharmonic response as the material is driven to large amplitudes towards a new monoclinic (1T') phase not observed in $WTe_2$ except at high pressures.

Driving Mechanism of Shear Mode

Figures 3A, 3B, 3C:
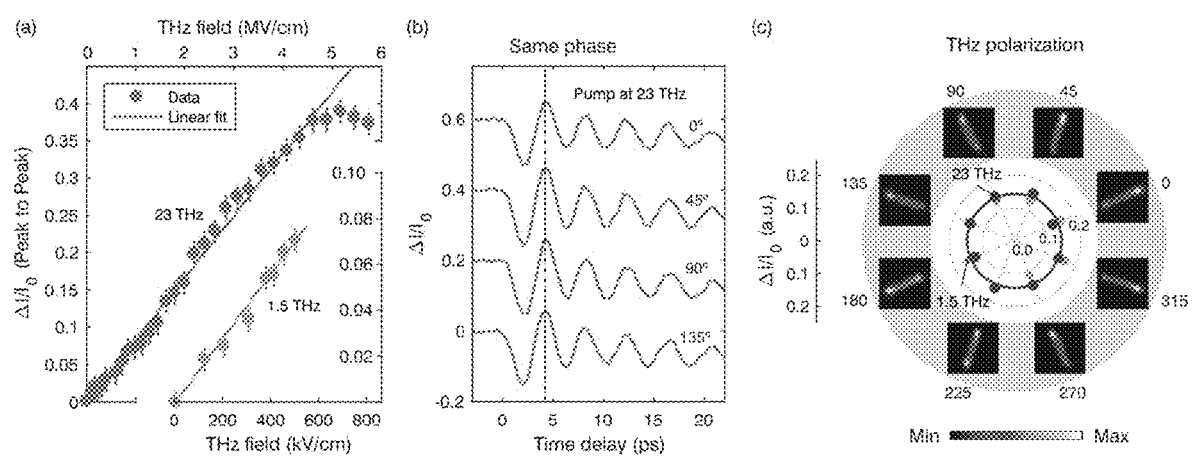
FIG. 3a illustrates Bragg peak intensity changes at increasing THz field strength at various THz frequencies.
FIG. 3b illustrates time-trace at various THz polarizations, showing that modulation starts at the same phase and amplitude regardless of the pump polarization.
FIG. 3c illustrates a polar plot of oscillation amplitude at various pump polarizations using various THz frequencies.

To investigate the driving mechanism, the shear amplitude is measured as a function of pump field strength and polarization. FIGS. 3a-3c illustrate field and polarization dependences of THz-induced shear amplitudes. FIG. 3a illustrates Bragg peak (130 plane) intensity changes at increasing THz field strength at frequencies of about 1.5 and about 23 THz. Both experiments show a linear dependence with THz electric field, indicating a field-driven mechanism for the coherent shear phonons in $WTe_2$.

FIG. 3b illustrates time-trace at various THz polarizations (about 23 THz pump), showing that the modulation starts at the same phase and amplitude regardless of the pump polarization. A similar feature is also observed using 1.5 THz pump.

FIG. 3c illustrates a polar plot of oscillation amplitude at various pump polarizations using about 1.5 THz and about 23 THz. The shaded area shows the THz pump polarizations used in FIGS. 3a-3b, monitored through the electron beam transverse displacements by the THz field. These results show that the driving mechanism of the shear mode is linear in the applied field strength and isotropic in the polarization.

The amplitude increases linearly with field under different off-resonant frequencies (as shown in FIG. 3a) and is polarization isotropic (as shown in FIGS. 3b and 3c). Moreover, the shear motion always starts towards positive displacement regardless of polarization (as shown FIG. 3b). This behavior cannot be explained merely through ISRS (impulsive stimulated Raman spectroscopy) mechanisms normally considered. A THz field-driven charge current mechanism is disclosed herein, as indicated by the linear response in field strength, and motivated by calculations that predict a Td-1T' transition in $WTe_2$ via hole doping at density of about $10^{20}$ cm$^{-3}$.

Microscopically, the applied field accelerates the electron population away from the topmost valence band, which constitutes an interlayer antibonding orbital. This destabilizes the interlayer coupling strength and launches a shear motion along the in-plane transition pathway from an orthorhombic (Td) phase to a monoclinic and centrosymmetric (1T') phase with a new equilibrium position ($\Delta y>0$) (as shown in FIG. 2e and FIG. 5). In experiment, the effective hole doping density can be estimated using a Drude model. The fraction of charge carriers that contributes to the field-driven current is $v/v_F = eE\tau/mv_F$, and gives a doping density of about $10^{20}$ cm$^{-3}$ comparable to the impulsive driving force for the interlayer shear motion. The THz-induced effective doping serves as an impulsive driving force to kick-start the shear mode, and does not need the excited carriers to be maintained during the long-lived metastable phase. Such metastable phase persists for a duration that is determined by the energy barrier of the local potential minimum and thermal fluctuations. Note that, although the observed long-lived offset (e.g., about 8 pm as shown in FIG. 2f) is somewhat smaller than that calculated for a complete transition to the 1T' phase (about 20-30 pm), the observed buildup time of about 25 ps is consistent with a shear wave propagation time for the tilting between the unit cells across the sample thickness for this transition to occur. This is in comparison to the observed photoinduced structural transition that happens rapidly in atomically-thin indium wires. To further address this, comparative measurements are performed in a related material, $MoTe_2$, which can crystallize in the Td and 1T' phases at different temperatures. Whereas in the Td phase light-induced shear displacements are observed, in the 1T' phase negligible signals are observed. This is consistent with a mechanism in which the THz fields drive the material unidirectionally towards 1T'.

The ability to drive a shear displacement using THz pulses provides a mechanism to manipulate the topological properties in the semimetal $WTe_2$ on ultrafast timescales. In some embodiments, there are a total of eight Weyl points (WP) in the equilibrium Td phase of $WTe_2$ in the $k_z=0$ plane. It is sufficient to consider two of these WPs in the $k_x$, $k_y>0$ quadrant because the remaining six WPs may be obtained through time-reversal and mirror symmetries. The two WPs carry opposite chiralities associated with topological charges $\chi^-=-1$ (WP1) and $\chi^+=+1$ (WP2) that are connected by a Fermi arc on the surface. Since the two WPs are separated mainly along $k_y$, there are large changes in the WP separation in momentum space by tuning the hopping parameters and band dispersion through interlayer shear strain along the y-axis. In this way, the induced shear strain acts on the Weyl fermions as a chiral gauge field vector potential, A, because it couples to WP1 and WP2 with opposite sign in momentum space, $p \rightarrow (p-\chi^{\pm}eA)$.

Figures 4A, 4B, 4C, 4D, 4E:
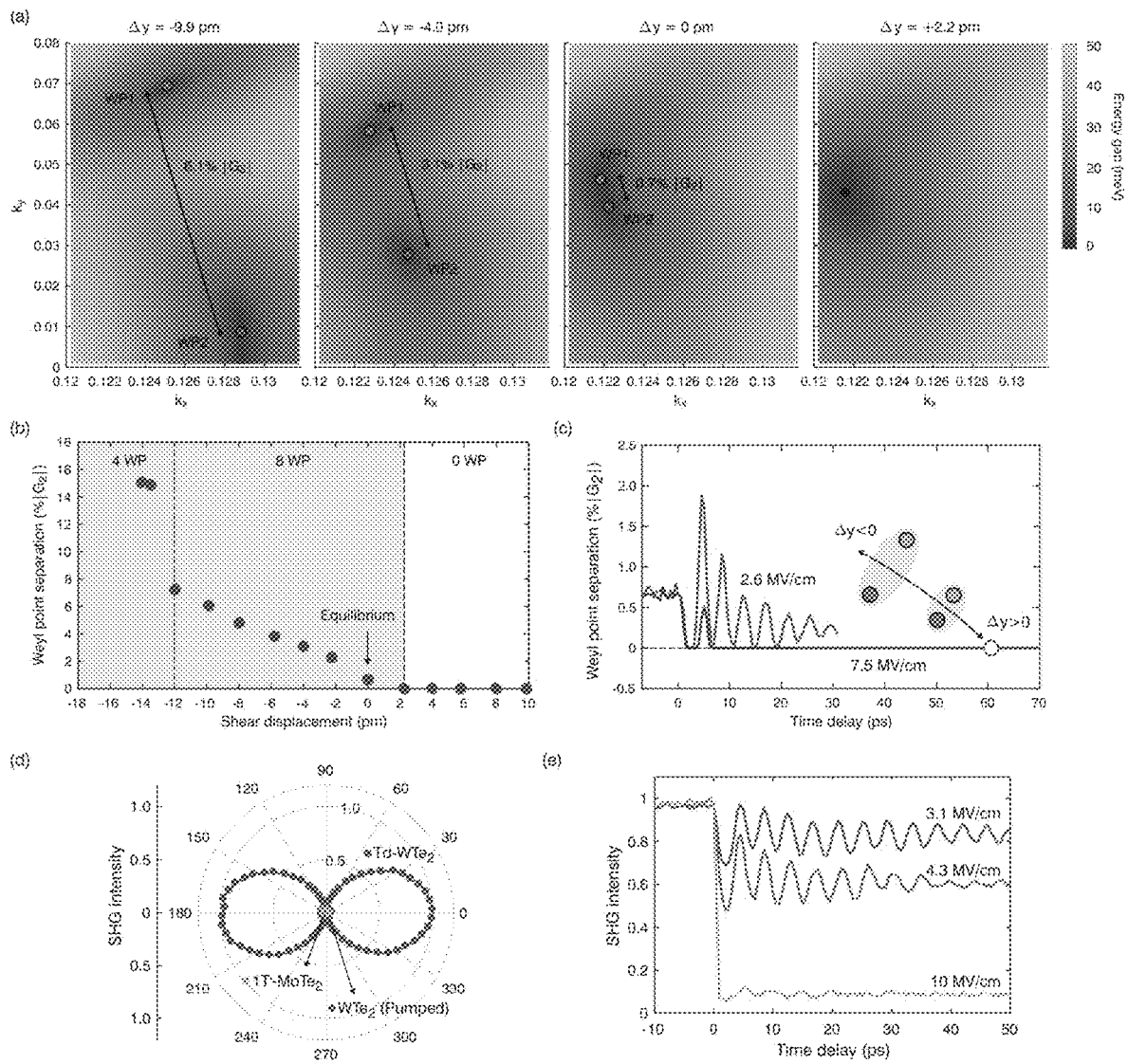
FIG. 4a illustrates the nearest two WPs (Weyl points) in the momentum space at various shear displacements $\Delta y$.
FIG. 4b illustrates a summary plot showing WP separation as a function of shear displacements.
FIG. 4c illustrates time-trace of WP separation upon launching shear motion using about 23 THz pump pulses at various fields.
FIG. 4d illustrates a SHG (second harmonic generation) polar plot of equilibrium $WTe_2$, pumped $WTe_2$, and centrosymmetric $MoTe_2$ at various SHG polarizer angles.
FIG. 4e illustrates pump-induced SHG time traces of $WTe_2$ at various pump field strengths.

Band Structure Calculations for Weyl Points at Different Interlayer Displacements To demonstrate the mechanism, the electronic band structure in $WTe_2$ is calculated using first principles DFT calculations and the positions of the WPs at different interlayer displacements $\Delta y$ are monitored (as shown in FIG. 4a). FIGS. 4a-4e illustrate strain-induced Weyl points separation and topological phase transition. FIG. 4a illustrates the nearest two Weyl points in the momentum space at various shear displacements $\Delta y$.

The DFT calculations can be performed using a Born-Oppenheimer approximation where electrons can instantaneously adjust to a new lattice environment. This is appropriate for the interlayer shear mode because the timescale is much longer than that of the electron's, and the use of a THz pump does not create significant electronic excitation. Type-II WPs result from crossings between electron and hole bands. Hence, by mapping the energy difference between the two bands in momentum space, the positions of the WPs can be identified as the zero-energy gap position. FIG. 4b illustrates a summary plot showing the WP separation as a function of shear displacements. At equilibrium ($\Delta y=0$), the WPs are separated by 0.7% of a reciprocal lattice vector $|G_2|$. At positive shear displacements (along the direction shown in FIG. 2e), the WPs move towards each other and mutual annihilation occurs at $\Delta y=+2.2$ pm. At negative shear displacements (opposite to the direction shown in FIG. 2e), the WPs move away from each other, leading to a more robust topological structure with a more than two-fold increased WP separation. This is consistent with the intuitive picture where positive shear moves towards a centrosymmetric and trivial phase, while negative shear moves towards a non-centro symmetric and topological phase.

At increasingly negative $\Delta y$, WP2 is approaching the mirror plane at $k_y=0$ and eventually annihilates with its mirror image of opposite chirality. This leads to a Lifshitz transition from a topological semimetal with eight WPs to one with four WPs, achieving the minimum nonzero number of WPs allowed in a time-reversal invariant system (as shown in FIG. 4b).

FIG. 4c illustrates time-trace of WP separation upon launching the shear motion using about 23 THz pump pulses at fields of about 2.6 MV/cm and about 7.5 MV/cm. At low fluence, the time-trace shows a clear oscillation toward opening and closing the WP separation. At high fluence, the WPs mostly annihilate each other.

While it is challenging to measure the distinct topological phases across the Lifshitz transition, the transition from a topological phase to a trivial phase can be experimentally verified using a time-resolved SHG (second harmonic generation) technique. In a situation where inversion symmetry in $WTe_2$ is restored, the electronic phase transition from a topological to trivial semimetal follows. This is because the emergence of Weyl point pair in materials is contingent on lifting the Kramers' double degeneracy from a Dirac cone by either breaking time-reversal or inversion symmetry. SHG arises from a nonzero second-order susceptibility as shown in non-centrosymmetric topological systems. Thus, it can be used as a sensitive probe to monitor the inversion symmetry and topological changes in $WTe_2$.

In the measurement, an about 2.1 μm pump pulse is used to induce the transition, which gives similar interlayer shear displacements induced by THz. FIG. 4d illustrates a SHG polar plot of equilibrium $WTe_2$, pumped $WTe_2$, and centrosymmetric $MoTe_2$ at various SHG polarizer angles. Here, the pump pulse is at about 2.1 μm (polarized at about 45° off the horizontal axis), the incident probe pulse is at about 800 nm vertically polarized, and the crystallographic a-axis is aligned horizontally. The emitted SHG propagates through a rotatable SHG polarizer where the transmission axis is aligned horizontally at about 0° angle or vertically at about 90° angle.

As shown in FIG. 4d, the SHG polarization scans of $WTe_2$ in the absence of pump pulse, shows two lobes oriented horizontally. After the pump pulse arrives (Δt=about 2 ps), the SHG vanishes almost completely in all polarizations, with magnitudes comparable to the detection noise level and to the measured SHG signal from centrosymmetric 1T'-$MoTe_2$.

FIG. 4e illustrates pump-induced SHG time traces of $WTe_2$ at various pump field strengths. At low fields, the SHG intensity oscillates with frequency of the shear mode at about 0.24 THz. The oscillation starts with a reduced SHG towards a centrosymmetric structure, consistent with the UED results (as shown in FIGS. 2e-2f). At high field, the SHG intensity plummets drastically approaching an about 100% reduction. This indicates that $WTe_2$ exhibits a structural transition from a non-centro symmetric to a centrosymmetric structure, consistent with diffraction studies, and corresponds to a topological-to-trivial phase transition.

Similar manipulations of the WPs in $WTe_2$ can be obtained through a compressive uniaxial strain along the a-axis. For example, at about 1% uniaxial strain the WP separation is 2.2% of $|G_2|$, and annihilation of WP2 at the mirror plane occurs at about 2% uniaxial strain with energy cost of about 32-39 meV per unit cell. This is about 1-2 orders of magnitude larger than the energy for a shear strain to cause the same effect, indicating that the interlayer strain provides a more energy-efficient mechanism to manipulate the topological band structure. In addition, shear displacement allows manipulation of WPs at THz frequencies. This ultrafast motion of the WPs in turn is associated with a time-varying elastic gauge potential A(t) and yields a pseudoelectric field E=−∂A/dt, which can be used as a way to modulate charge density between bulk and surface.

Sample Synthesis and Preparation

In some embodiments, high-quality single crystals of $WTe_2$ can be synthesized through a self-flux method in excess of Te: W 99.999% and Te 99.9999% powders are placed in a quartz ampoule in a ratio of about 1:25, are heated to about 1100° C. and are held at this temperature for three days. Subsequently, the ampoule is slowly cooled down to about 525° C. over about two weeks and centrifuged. The "as harvested" single crystals were then annealed for about two days at a temperature of about 425° C. under a temperature gradient to remove excess Te. To prepare the synthesized samples for UED experiments, $WTe_2$ can be mechanically exfoliated onto a $SiO_2$/Si substrate using mechanical exfoliation technique. From the exfoliated crystal, the samples are selected for subsequent transfer by their size (e.g., >about 50 μm in the lateral dimension) and thickness (e.g., >about 50 nm). After verifying the thickness using an atomic force microscope, poly(propylene carbonate) (PPC) in anisole solution (about 15% PPC by weight) is spun onto the $WTe_2$ covered $SiO_2$/Si substrate at a rate of about 1500 rpm with an acceleration of about 1000 rpm/s for about 1 minute, then heated up to about 80° C. for about 2 minutes on a hotplate. The PPC film and the $WTe_2$ crystal are then peeled from the substrate and suspended over a hotplate with the $WTe_2$ facing up. An about 50 nm $Si_3N_4$ TEM membrane is then aligned over the suspended crystal using an optical microscope and placed on the PPC film while raising the temperature up to about 115° C. to induce contact between the $WTe_2$ crystal and membrane. The sample is then soaked in acetone for about 10 minutes to remove the PPC, gently rinsed with isopropyl alcohol, and dried under a flow of nitrogen gas, thus completing the transfer.

UED Setup

In some embodiments, a relativistic UED technique can be used to reconstruct the shear motion and crystallographically measure the corresponding atomic displacements through the measurement of more than about 200 Bragg peaks (as shown in FIG. 1b). The electron beam is generated using a frequency-tripled Ti:sapphire laser by excitation of a copper photocathode, and rapidly accelerated to about 3 MeV in radiofrequency electric fields. The pulse duration of the electron beam at the sample position is about 150 fs. Magnetic lenses are used to steer and focus the electron beam onto the sample, an exfoliated single-domain crystal, with a spot size of about 100 μm. The diffracted electron beam is captured in a transmission geometry using an EMCCD (electron-multiplying charge-coupled device) camera. In some embodiments, two different pump excitation schemes may be used in the experiment, involving a quasi-single cycle excitation at about 1.5 THz and a few-cycle excitation at about 23 THz. The arrival time of the electron beam (probe) can be adjusted with respect to the THz pulses (pump) using an optical delay stage.

Ultrafast THz Sources

In some embodiments, quasi single-cycle THz pulses may be generated by optical rectification of about 1350 nm near-IR (infrared) laser pulses in organic nonlinear crystals DSTMS (4-N,N-dimethylamino-4'-N'-methyl-stilbazolium 2,4,6-trimethylbenzenesulfonate) and OH-1 (2-(3-(4-Hydroxystyryl)-5,5-dimethylcyclohex-2-enylidene)malononitrile). The about 1350 nm near-IR pulses were generated from an about 800 nm Ti:sapphire laser system in a three-stage optical parametric amplifier system (e.g., Light Conversion HE-TOPAS) and had pulse energies up to about 2 mJ and a pulse duration of about 50 femtoseconds.

The THz field is brought to an intermediate focus with an about 2-inch (about 50.4 mm) focal length off-axis parabolic mirror, collimated with a second, about 6-inch (about 152.4 mm) focal length mirror. The collimated beam is transported into the UED diffraction chamber via a polymer window and focused with an about 3-inch (about 76.2 mm) focal length off-axis parabolic mirror inside the chamber. The THz field is characterized at the sample location by electro-optical sampling using a split-off portion of the about 800 nm laser and an about 50 μm thick 110-cut GaP crystal. The observed peak field strength of the DSTMS-generated THz pulse is about 650 kV/cm, with the spectrum centered at about 3 THz, when using an about 8 mm diameter and about 450 μm thick crystal and about 1 mJ pump pulse energy. With an about 10 mm clear aperture and about 500 μm thick crystal OH-1 crystal, the peak field strength is about 500 kV/cm, with the spectrum peaked at about 1.5 THz with significant spectral components extending to about 3.5 THz (as shown in FIG. 6). The polarization of the THz pulses is linear and the polarization angle can be changed arbitrarily by rotating the generation crystal together with the pump pulse polarization.

Mid-infrared (MIR) pulses with about 13 μm wavelength (about 23 THz frequency) is generated by difference frequency generation in GaSe from the signal and idler of the same Light Conversion HE-TOPAS OPA system driven by about 130 fs duration of about 800 nm pulses. Here the signal and idler wavelengths are about 1505 nm and about 1705 nm, respectively. The MIR beam is transported into the experimental chamber through an about 3-mm thick KRS-5 window and focused with an about 3-inch (about 76.2 mm) focal length off-axis parabolic mirror. A pair of holographic wire-grid polarizers (Thorlabs WP25H-K) is used to attenuate the pulse energy to the desired level. The pulse duration of the MIR pulses is on the order of about 300 fs after taking into account dispersion. MIR spot-size measurements at the sample position is obtained with a DataRay WinCamD beam profiler.

Structure Factor Calculation with Interlayer Shear Displacement

In some embodiments, the intensity of a Bragg peak, I $\propto |S|^2$, can be calculated using the general form of the structure factor:

$$S(hkl) = \Sigma f_j \exp(-i2\pi(hx_j + ky_j + lz_j))$$

where the summation runs over all atoms in the unit cell (4 W and 8 Te), $f_j$ is the atomic scattering factor for j-th atom, $r_j = x_j \hat{a} + y_j \hat{b} + z_j \hat{c}$ is the vector position of the atom in the unit cell (0≤x, y, z≤1), and (hkl) are the usual Miller indices. Since transmission geometry is used at [001] zone axis, the diffraction image solely shows the l=0 peaks, namely (hk0). The peak intensity modulation $\Delta I/I_0$ is calculated by introducing the top layer shear displacement Δy with respect to the bottom layer into the structure factor:

$$S(\Delta y) = \exp(-i2\pi k \Delta y) \sum_{top} f_j \exp(-i2\pi(hx_j + ky_j)) + \sum_{bottom} f_j \exp(-i2\pi(hx_j + ky_j))$$

A more symmetric expression can be obtained by having the shear displacement shared equally between the two layers (Δy/2), namely by multiplying with a common phase factor $\exp(+i\pi k \Delta y)$ and by using the underlying crystal symmetry through 1) a reflection with respect to the b-c mirror plane (x→−x); and 2) a non-symmorphic $C_2$ transformation. The latter includes reflection with respect to the a-c mirror plane (y→−y) and a translation along the a-c axis (+0.5, 0, +0.5). These symmetry operations project each atom from the bottom layer to the top layer:

$$S(\Delta y) = \exp(-i\pi k \Delta y) \sum_{top} f_j \exp(-i2\pi(hx_j + ky_j)) +$$
$$\exp(+i\pi k \Delta y) \sum_{top} f_j \exp(+i2\pi(hx_j + ky_j))$$
$$= 2 \sum_{top} f_j \cos(2\pi(hx_j + ky_j) + \pi k \Delta y)$$

Now the summation runs over all atoms in the top half of the unit cell (2 W and 4 Te). To compare this with experiment, the change of peak intensity $\Delta |S(\Delta y)|^2 = |S(\Delta y)|^2 - |S(0)|^2$ is calculated using given $x_j$ and $y_j$ values, and is plotted in FIG. 2b. The structure factors $f_j$ are calculated using X-ray scattering factors from analytical fits converted to electron scattering factors using the Mott-Bethe formula. Here, a positive shear displacement (Δy>0) is specified as shown in the inset of FIG. 2e.

Fitting the Structural Factor Modulations

In some embodiments, for each time point Δt, the mean squared error (R) is calculated for a range of shear displacements Δy for a selection of m Bragg peaks (hkl). In addition, an anisotropic (elliptical) Debye-Waller factor is included to account for heating effects in the sample, which is significantly smaller than those from the shear displacements due to the low pump photon energy (THz). The mean squared error is:

$$R(\Delta y, \langle u_a^2 \rangle, \langle u_b^2 \rangle) = \frac{1}{m} \sum_{hkl} \left( \frac{\Delta I}{I_0}(hkl, \Delta y, \langle u_a^2 \rangle, \langle u_b^2 \rangle)_{sim} - \frac{\Delta I}{I_0}(hkl)_{exp} \right)^2$$

where $\langle u_a^2 \rangle$ and $\langle u_b^2 \rangle$ are the mean squared atomic displacements along the a and b axes, respectively, which affect the intensity of a Bragg peak by the Debye-Waller relation, $$I = I_0 e^{-\frac{1}{2}(Q_a^2 \langle u_a^2 \rangle + Q_b^2 \langle u_b^2 \rangle)}$$

with a time constant determined by the (400) Bragg peak. Here, $Q_a$ and $Q_b$ are the projections of Q, the reciprocal lattice vector of the Bragg peak, along the a and b axes. The simulated intensity change, $(\Delta I/I_0)_{sim}$, has the form:

$$\frac{\Delta I}{I_0}(hkl, \Delta y, \langle u_a^2 \rangle, \langle u_b^2 \rangle)_{sim} = \frac{|S(\Delta y)|^2 e^{-\frac{1}{2}(Q_a^2 \langle u_a^2 \rangle + Q_b^2 \langle u_b^2 \rangle)} - |S(0)|^2}{|S(0)|^2}$$

Here, S(Δy) is the structure factor calculated for a given Δy and S(0) is the structure factor calculated for the undistorted structure. The values for each parameter Δy, $\langle u_a^2 \rangle$, and $\langle u_b^2 \rangle$ at every Δt are optimized by minimizing R. In other words, the fitting procedure is performed to minimize the peak intensity difference between experiment and simulation and is averaged across the many Bragg peaks.

Estimating the Effective THz-Induced Hole Doping

In some embodiments, a Drude model can be used to estimate the effective hole doping. The fraction of electrons that contribute to the resulting current is $v/v_F$, where v is the drift velocity and $v_F$ is the Fermi velocity. The drift velocity can be estimated through $v=eE\tau/m$, where e is the electron charge, E is the applied electric field, r is the scattering time, and m is the effective mass. By using the reported values of m~0.4 $m_e$, $v_F$~3×10$^5$ m/s, a typical value of $\tau$~10 fs in a semimetal, and taking E~1 MV/cm, it is found that v~$v_F$. For a hole pocket with carrier density of $n_o$~7×10$^{19}$ cm$^{-3}$ in WTe$_2$, this is comparable with an effective hole doping density for the Td-1T' phase transition as the impulsive driving force for the interlayer shear motion. Moreover, recent experiments report significantly larger scattering time values of $\tau$>about 100 fs in WTe$_2$. This indicates that an even larger electron density can be transiently transferred away from the topmost valence band by the THz pump field to induce the interlayer shear motion.

DFT Analysis

In some embodiments, DFT simulations of WTe$_2$ are performed to ascertain the energetics of the experimentally observed about 0.24 THz shear mode of interest (FIG. 2e) and the Brillouin-zone (BZ) motion of Weyl points resulting from atomic displacements associated with this mode. The stability of Weyl nodes in WTe$_2$ is sensitive to lattice parameter differences on the order of about 1% and, in fact, due to slight (about 1%) inaccuracies in the vdW (van der Waals)-DFT predicted a and c parameters, Weyl points of opposite chiralities annihilate at the vdW-DFT equilibrium geometry of WTe$_2$ rendering it a trivial semimetal. To recover distinct Weyl nodes in the BZ, small strains should be applied.

In order to circumvent the issues related to the sensitive dependence on specific vdW-DFT geometries, the experimental geometry is used to perform the analysis of the BZ motion of the Weyl nodes in WTe$_2$ under the influence of shear-mode displacements along the y-axis (crystallographic b-axis). This geometry is characterized by an orthorhombic (Td) lattice, with parameters a=3.477 Å, b=6.249 Å and c=14.018 Å, and W and Te atoms occur at the 2a Wyckoff positions parameterized as (0, y, z) and (½, -y, z+½) for values of y, z given in Table 1. Simulations in this context are performed using the DFT framework. All calculations include SOC (spin-orbit coupling) within the non-collinear DFT formalism. XC (exchange-correlation) effects are treated at the level of the generalized gradient approximation through a functional. Projector augmented wave (PAW) potentials with valence electronic configurations of {6s$^2$, 5d$^4$} for W and {5s$^2$,5p$^4$} for Te are employed in conjunction with a plane-wave energy cutoff parameter of about 260 eV. For converging the electron density, a Γ-centered 12×10×6 k-point grid and Gaussian smearing with a smearing parameter of about 0.05 eV are used. Weyl point positions in the k$_z$=0 plane of the BZ of WTe$_2$ are subsequently identified through band-structure calculations employing a dense 43×85×1 k-point mesh spanning a sub-region of the (k$_x$, k$_y$, k$_z$=0) plane as shown in FIG. 4a. At the employed geometry, two Weyl points (WP1, WP2) are identified in the first quadrant of the k$_z$=0 plane of the BZ at the coordinates shown in Table 2. The remaining 6 points in the other three quadrants are related to these by reflections in the k$_x$=0 and k$_y$=0 planes.

TABLE 1

Wyckoff position parameters for the coordinates of W and Te atoms in the experimentally determined unit cell of WTe$_2$

|   | W(1) | W(2) | Te(1) | Te(2) | Te(3) | Te(4) |
|---|---|---|---|---|---|---|
| y | 0.60062 | 0.03980 | 0.85761 | 0.64631 | 0.29845 | 0.20722 |
| z | 0.5 | 0.01522 | 0.65525 | 0.11112 | 0.85983 | 0.40387 |

TABLE 2

Coordinates and Chern numbers of the two Weyl points occurring in the first quadrant of the k$_z$ = 0 plane of the BZ of WTe$_2$. The last column indicates the Chern number (C) of the nodes.

|   | k$_x$ | k$_y$ | k$_z$ | C |
|---|---|---|---|---|
| WP1 | 0.12195 | 0.03947 | 0 | +1 |
| WP2 | 0.12160 | 0.04510 | 0 | −1 |

Figure 7:
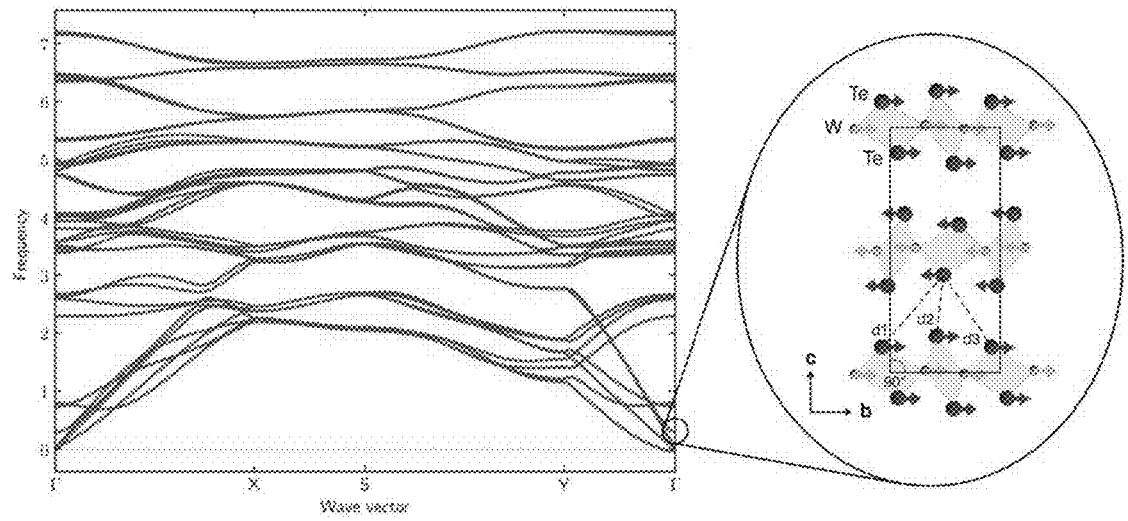
FIG. 7 illustrates a phonon band structure of $Td-WTe_2$.

Phonon band-structures are calculated within the frozen-phonon finite-difference approach. In FIG. 7, the phonon band dispersions of Td-WTe$_2$ at the experimental reference geometry, are plotted along high-symmetry lines in the k$_z$=0 plane. At the Γ-point, the low-energy mode at about 0.29 THz is unambiguously identified as the relevant interlayer shear mode of interest, which corresponds to the about 0.24 THz mode observed experimentally. This identification is facilitated by the absence of any other modes at similar energies and also by inspecting the atomic position modulations associated with the mode-eigenvector. As denoted in FIG. 2e, this mode predominantly involves a relative shear displacement along the b-axis, of adjacent WTe$_2$ layers in the unit cell. To investigate the motion of Weyl points in the BZ induced by this mode, firstly a number of unit cell geometries modulated along the mode displacement coordinate are generated using the phonopy code. Subsequently, the DFT electronic band structures corresponding to these modulated geometries are calculated and the positions of Weyl points in the BZ are mapped as a function of displacement along the mode coordinate as shown in FIG. 4a. As explained in connection with FIG. 4a, depending upon the sign of the shear mode displacement along the b-axis, pairs of Weyls points either move closer or farther apart in the BZ, leading to different kinds of topological transitions.

In topological semimetals such as WTe$_2$, the positions of Weyl points in the BZ can be tuned by applying strain. The changes in the relative positions of Weyl nodes in WTe$_2$ can be induced by uniaxial tensile and compressive strains applied along different crystallographic axes. While stretching along the a-axis leads to annihilation of all pairs of Weyl nodes, compressive strain along this direction leads to increased separation within each pair of Weyl points until half the points eventually annihilate on the k$_y$=0 mirror plane leading to a state where just four Weyl nodes survive. As explained in the analysis accompanying FIGS. 4a-4e, a similar motion of the Weyl points can be induced via an alternate mechanism, namely THz-pump induced phonon modulations associated with the about 0.24 THz shear-mode along the b-axis. It is therefore instructive to evaluate the relative energy cost associated with these two approaches for tuning the topological properties of WTe$_2$. To this end DFT total energies of different strained and phonon modulated structures associated with the Weyl point motion are compared. Calculating the total energy cost under different deformations of the lattice involves identifying the minimum energy point associated with the equilibrium geometry.

Therefore, for this analysis, geometry optimizations within the dispersion corrected DFT-D3 framework including spin-orbit coupling are performed. A plane-wave cutoff of about 400 eV in conjunction with a Γ-centered 16×9×4 k-point grid is employed in this instance. XC effects are modeled and, additionally, dispersion corrections are incorporated at the level of the DFT-D3 approximation. In particular, two different forms for the dispersion corrections are investigated, namely DFT-D3 (labelled D3) and DFT-D3 with Becke-Johnson (BJ) damping (labelled D3-BJ). The lattice parameters and relevant interlayer distances $d_1$, $d_2$, $d_3$ (see FIG. 2e) in Td-WTe$_2$ predicted by the two methods are listed in Table 3 and compared to experimental values.

TABLE 3

Calculated lattice and interlayer distance parameters of Td-WTe$_2$ are compared to experiment. The last column shows the calculated phonon frequency of the b-axis shear mode of interest.

| | a (Å) | b (Å) | c (Å) | $d_1$ (Å) | $d_2$ (Å) | $d_3$ (Å) | $v_{shear}$ (THz) |
|---|---|---|---|---|---|---|---|
| D3 | 3.4807 | 6.2806 | 13.9973 | 5.3104 | 3.8734 | 5.0137 | 0.15 |
| D3-BJ | 3.4841 | 6.2528 | 13.5910 | 5.2570 | 3.7169 | 4.7787 | 0.34 |
| Experiment | 3.477 | 6.249 | 14.018 | 5.397 | 3.911 | 4.937 | 0.24 |

Figures 8A, 8B:
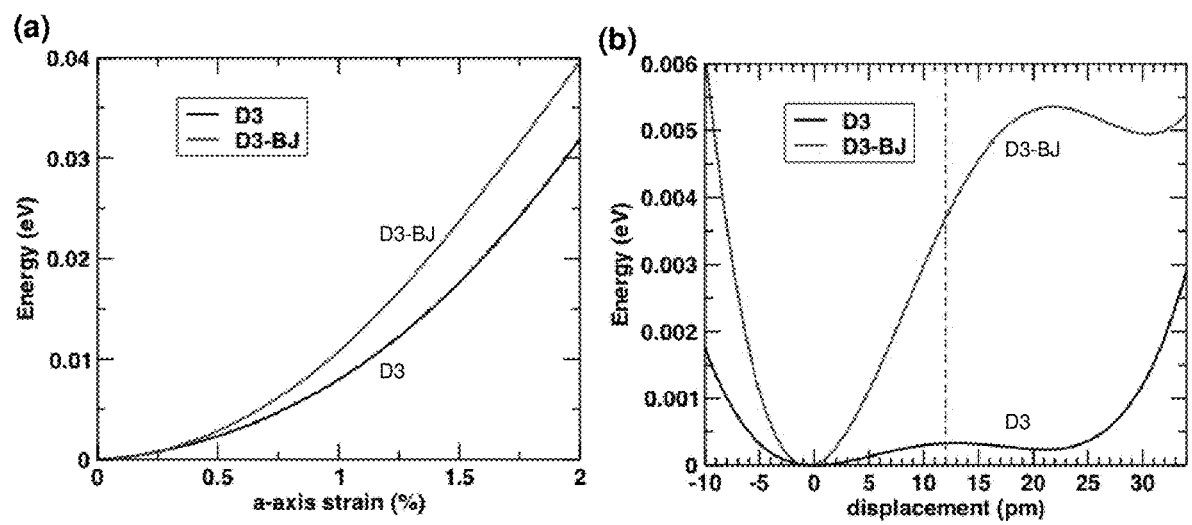
FIG. 8a illustrates energy as a function of uniaxial strain applied along a-axis.
FIG. 8b illustrates energy as a function of displacement along shear mode coordinate.

The last column of Table 3 shows the calculated and experimental phonon frequency for the b-axis shear mode. This mode is well-approximated as a rigid relative motion along the b-axis of the two WTe$_2$ layers in the unit cell (see FIG. 7). The potential energy associated with this motion is predominantly determined by the interlayer vdW interaction, at least for small displacements, and therefore exhibits a strong dependence on the way the dispersion corrections are approximated in DFT. Note that while the D3 method yields lattice parameters that are within about 0.5% of experiment, the b-axis shear mode phonon frequency is underestimated by about 37%. On the other hand, the D3-BJ approximation predicts a mode frequency that is overestimated by about 40%. In the harmonic approximation within which the phonon frequency is estimated, this corresponds to a picture where the potential energy surface associated with displacement along the shear mode is too shallow and too steep in the D3 and D3-BJ approximations, respectively. Although neither method is quantitative, the correct description lies in between the two limits represented by D3 and D3-BJ. With this understanding, an order of magnitude comparison is provided between the relevant strain and phonon modulation energies for driving Weyl point motion in WTe$_2$. Referring to the equilibrium geometry, the total energy cost per unit cell as a function of applied compressive strain along the a-axis is shown in FIG. 8a. Similarly, the total energy cost associated with structural modulation by the b-axis shear phonon as function of displacement along the mode coordinate is shown in FIG. 8b. The displacement (in pm), along the b-axis, of one of the W atoms is used as a proxy for the mode coordinate. In order to annihilate two pairs of Weyl nodes at the $k_y$=0 mirror plane, either an about 2% a-axis compressive strain or an about 12 pm negative displacement (FIG. 2e) is used. On a per unit cell basis, in the D3 approximation the former mechanism has an energy cost of about 32 meV while the latter costs about 0.33 meV. Similarly, on a per unit cell basis, in the D3-BJ approximation the former mechanism has an energy cost of about 39 meV while the latter costs about 3.6 meV. Thus for driving the topological transition from eight to four Weyl nodes, the lattice strain mechanism is one to two orders of magnitude more expensive compared to the phonon driven mechanism in terms of energy. This is because a-axis strain involves compressing or elongating strong covalent bonds within each layer of WTe$_2$ while b-axis shear mode involves primarily interlayer interactions which are weaker.

Longitudinal Acoustic Wave Timescale

In some embodiments, in WTe$_2$, the stable Td phase appears as an orthorhombic unit cell where the b-c axes make θ=about 90° angle, while the 1T' phase appears as a monoclinic unit cell with about 94° angle (FIG. 5). Hence, the Td-1T' transition in WTe$_2$ may be constrained by the timescale for the development of an overall shear across the sample thickness (c-axis), as determined by the transverse acoustic group velocity. The longitudinal acoustic (LA) speed of sound can be used as a first approximation of about 2000 m/s. Hence, the buildup time can be estimated through t=d/v, where d (=about 50 nm) is the sample thickness and v (=about 2000 m/s) is speed of sound, and obtain t=about 25 ps. This is in good agreement with the observation shown in FIG. 2f.

Figure 9:
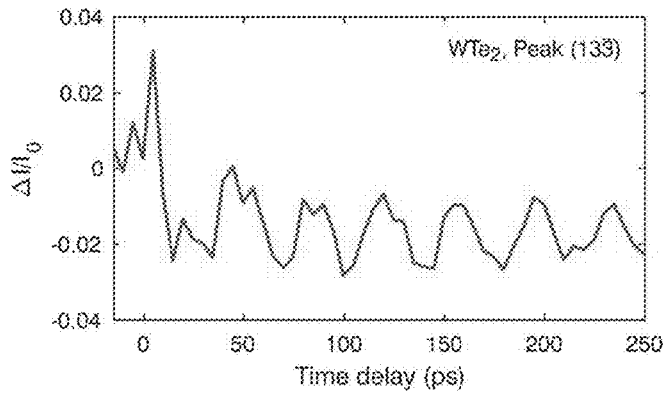
FIG. 9 illustrates a determination of transverse acoustic propagation time across sample thickness.

A separate confirmation of the LA speed of sound can be used by tilting the sample (Pitch=about −8.3°, Yaw=about −13.9°), providing sensitivity to the acoustic breathing mode oscillations (period=2d/v) across the sample thickness. The structural factor modulation $\Delta I/I_0$ of peak (13$\bar{3}$) shows oscillations with period of about 38 ps (FIG. 9). Given the period of this oscillation, the speed of sound is computed to be v~2600 m/s, in reasonable agreement with the above estimate.

THz-Induced Shear Motion in MoTe$_2$

Figure 10:
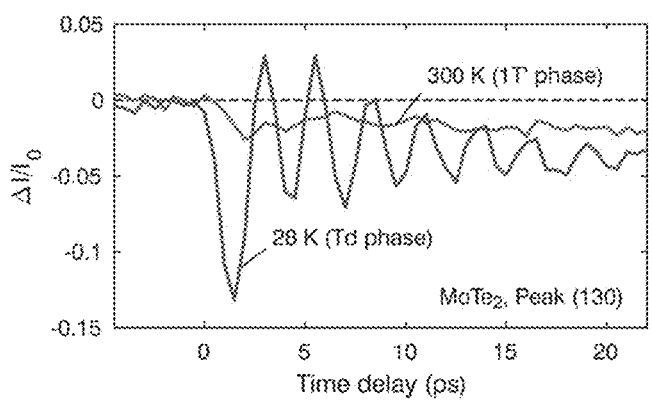
FIG. 10 illustrates emergence of THz-induced shear oscillations in $MoTe_2$ measured at two different temperatures.

In some embodiments, the shear motion in WTe$_2$ is driven through a transient hole doping induced by the THz field. This interpretation is motivated by a theoretical prediction that upon hole doping the Td phase becomes unstable against the 1T' phase. A particularly strong indication from the experiment is that at any THz field polarization the initial shear motion always occurs along the pathway towards a phase transition from Td phase to 1T' phase. Hence, this process may be sensitive to the initial structural phase of the sample, namely, it may occur in Td phase and not in 1T' phase, a feature that can be tested. In particular the absence of THz-induced shear motion may be observed in 1T'-MoTe$_2$. MoTe$_2$ and WTe$_2$ have similar structural and electronic properties; unlike WTe$_2$, however, MoTe$_2$ can appear in two structural phases: Td phase below about 200 K, 1T' phase above about 250 K, and mixed Td-1T' phase between about 200-250 K. Similarly, THz-pump UED-probe experiments are performed on MoTe$_2$ at sample temperatures of about 28 K (Td) and about 300 K (1T') (FIG. 10). As shown, the interlayer shear oscillations occur in the Td phase (about 0.37 THz), and not in the 1T' phase of MoTe$_2$ where just a small heating (Debye-Waller) effect is observed. This is consistent with the mechanism that THz-induced hole doping stabilizes the 1T' phase over the Td phase. That is, if starting with Td phase the relative energy order is reversed upon THz-induced hole doping and shear motion is launched, but if starting with 1T' phase the relative energy order does not change and no shear motion is observed.

Transition Region at Intermediate Pump Fluences

In some embodiments, the UED time-traces (FIG. 2f) show that the oscillation period is slightly longer at larger pump field strengths. To investigate this transition region, an additional THz-pump, UED probe can be used at finer changes of pump fluences (FIGS. 11a-11b). As shown, the oscillation period increases at higher pump fluences. This observation indicates a nonlinear phonon softening toward a new metastable centrosymmetric structure.

Lifetime of Excited Electrons

Figure 12:
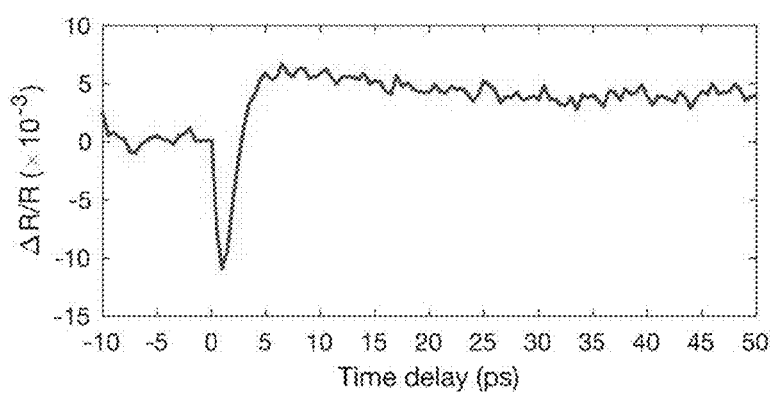
FIG. 12 illustrates pump-induced reflectivity changes on $WTe_2$.
Figure 13:
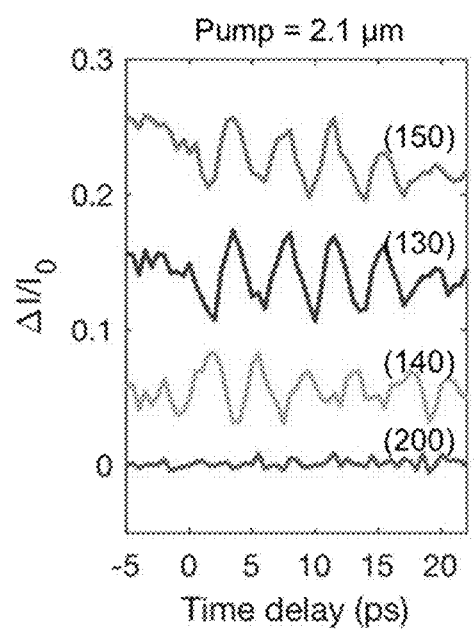
FIG. 13 illustrates Bragg peak intensity changes as a function of time delay between about 2.1 μm pump pulses and an electron beam.

In some embodiments, the lifetime of excited electrons can be determined from the pump-induced probe reflectivity as a function of time. An optical pump-probe experiment can be performed using about 2.1 μm pump and about 800 nm probe pulses on $WTe_2$ sample (FIG. 12). Note that the role of THz pump is replaced with an about 2.1 μm pump because the THz pump setup used for UED uses a special laser specification and is not accessible for optical reflectivity experiment. Nevertheless, measurements with about 2.1 μm pump can also induce the shear oscillations that are obtained using THz pump (FIG. 13). FIG. 12 shows an abrupt pump-induced change of probe reflectivity within about the first 5 ps, and a stable finite reflectivity afterwards for a timescale longer than about 50 ps. The first 5 ps can be attributed to relaxation of hot carriers toward a new quasi-equilibrium state. Afterwards, the carriers remain in the new equilibrium state for longer than about 50 ps.

Additional Illustrations

Figures 5A, 5B, 5C:
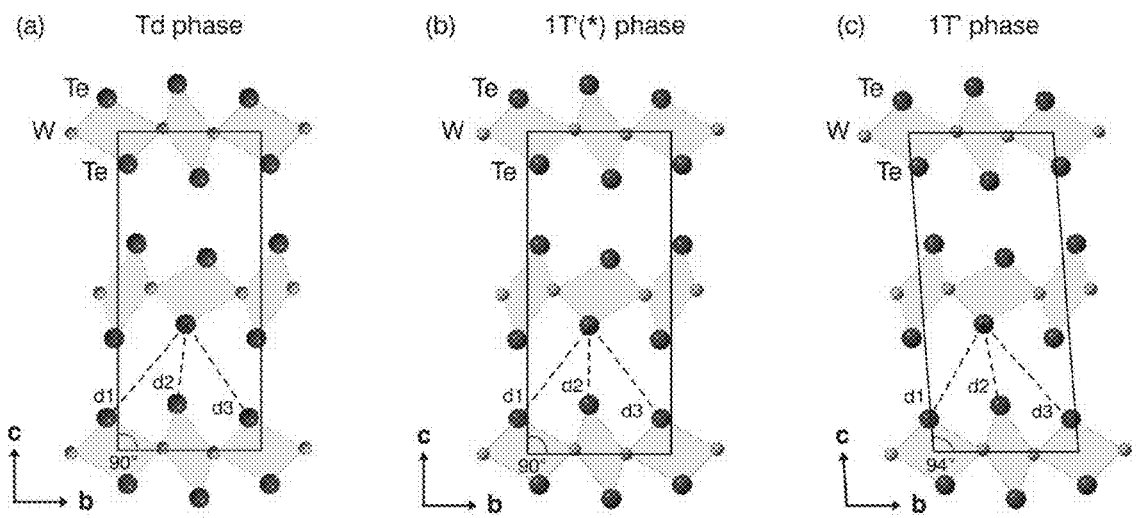
FIG. 5a illustrates a lattice structure of $WTe_2$ at an equilibrium phase.
FIG. 5b illustrates a lattice structure of $WTe_2$ at another phase.
FIG. 5c illustrates a lattice structure of $WTe_2$ at yet another phase.

FIG. 5a illustrates a lattice structure of $WTe_2$ at Td phase. FIG. 5b illustrates a lattice structure of $WTe_2$ at Td* phase. FIG. 5c illustrates a lattice structure of $WTe_2$ at 1T' phase. Td phase has an orthorhombic non-centro symmetric unit cell with b-c angle of about 90° and bond length $d_1 > d_3$. Td* phase has an orthorhombic centrosymmetric unit cell with b-c angle of about 90° and bond length $d_1 = d_3$. 1T' phase has a monoclinic centrosymmetric unit cell with b-c angle of about 94° and bond length $d_1 < d_3$.

Figures 6A, 6B:
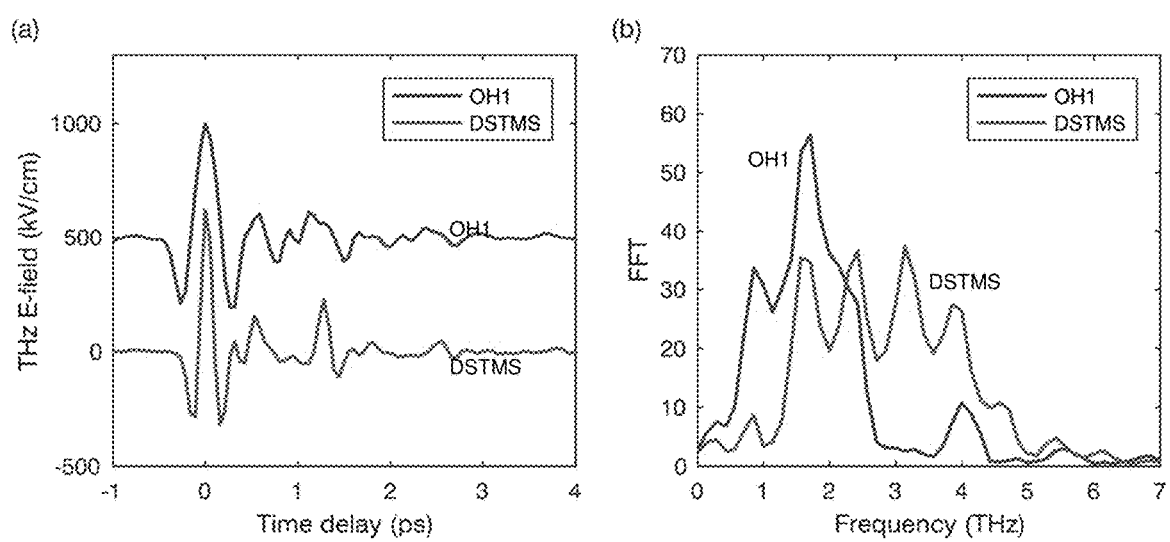
FIG. 6a illustrates THz electric field time trace for quasi single-cycle THz pulses generated in organic nonlinear crystals and associated amplitude spectra.
FIG. 6b illustrates frequency bandwidth of THz field for quasi single-cycle THz pulses generated in organic nonlinear crystals and associated amplitude spectra.

FIG. 6a illustrates THz electric field time trace for the quasi single-cycle THz pulses generated in OH1 and DSTMS and associated amplitude spectra. FIG. 6b illustrates frequency bandwidth of the THz field for the quasi single-cycle THz pulses generated in OH1 and DSTMS and associated amplitude spectra, calculated using the Fourier transform of results of FIG. 6a.

FIG. 7 illustrates a phonon band structure of Td-$WTe_2$. Dispersions for wave-vectors along high-symmetry lines in the $k_z=0$ plane are shown. The schematic on the right shows the interlayer shear motion as rigid displacements between $WTe_2$ alternating layers.

FIG. 8a illustrates energy as a function of uniaxial strain applied along the a-axis. Two different forms are used for the dispersion corrections, namely DFT D3 and DFT D3-BJ with Becke-Johnson (BJ) damping. These two corrections result in slightly different lattice constants, as shown in Table 3, and yield potential energy surfaces that are too shallow and too steep in the D3 and D3-BJ approximations, respectively. The correct description lies in between the two limits represented by D3 and D3-BJ. FIG. 8b illustrates energy as a function of displacement along the shear mode coordinate. The dashed line indicates the displacement at which two pairs of Weyl nodes annihilate at the $k_y=0$ mirror plane (see FIGS. 4a-4e).

FIG. 9 illustrates a determination of transverse acoustic propagation time across sample thickness.

FIG. 10 illustrates emergence of THz-induced shear oscillations in Td-$MoTe_2$ measured at two different temperatures (about 28 K and about 300 K). The lattice structure at these two different temperatures can be slightly different.

FIGS. 11a and 11b illustrates additional THz-pump UED probe measurements at various pump fluences to demonstrate the evolution in the transition region towards the switching behavior. FIG. 11a illustrates intensity changes of (130) Bragg peak corresponding to the interlayer shear oscillation that exhibits a phonon softening at larger pump fluences. FIG. 11b illustrates a surface plot where the $\Delta I/I_0$ is shown by pixel scales. Interpolation is used in FIG. 11b to show a clearer picture on the frequency shifting at larger pump fluences.

FIG. 12 illustrates pump-induced reflectivity changes on $WTe_2$. The pump pulse is at about 2.1 μm and the probe pulse at about 800 nm. Transient reflectivity gives a direct experimental probe to the electronic system. There is an abrupt change of $\Delta R/R$ right after the pump pulse arrival, within about 5 ps timescale. Afterwards, the $\Delta R/R$ signal remains finite and stable for a timescale longer than about 50 ps.

FIG. 13 illustrates Bragg peak intensity changes as a function of time delay between the about 2.1 μm pump pulses and the electron beam. The intensity changes show oscillations that correspond to the interlayer shear mode frequency of about 0.24 THz, similar to the effect produced by THz pump pulses.

Figure 14:
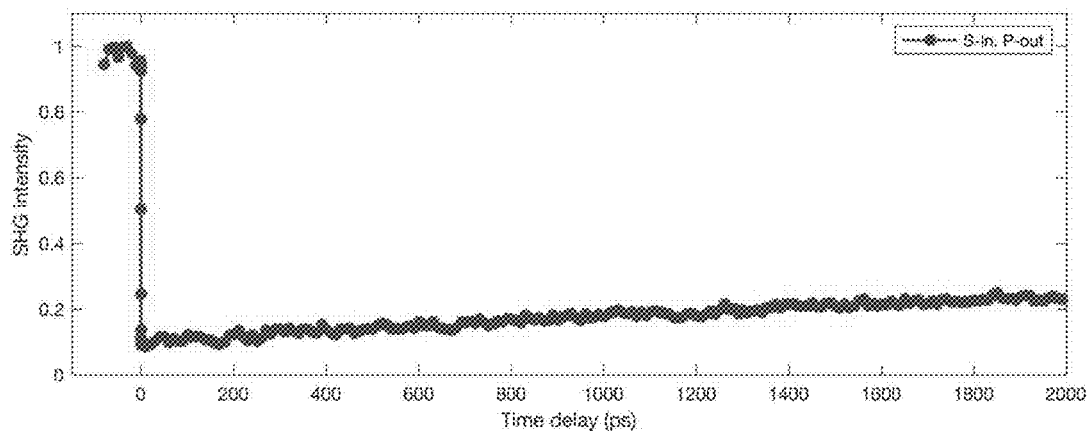
FIG. 14 illustrates time-resolved SHG of $WTe_2$ at about 2-ns time delay.

FIG. 14 illustrates time-resolved SHG of $WTe_2$ at nanosecond time delay. Here, the pump pulse is at about 2.1 μm (polarized at about 45° off the horizontal axis), the incident probe pulse is at about 800 nm, the crystal a-axis is aligned horizontally, and the SHG is detected at "S-in P-out" configuration. This shows that the light-induced centrosymmetric phase lives for about a few nanoseconds or even about tens of nanoseconds, which is consistent with the induced metastable phase.

Example Embodiments

Figure 15:
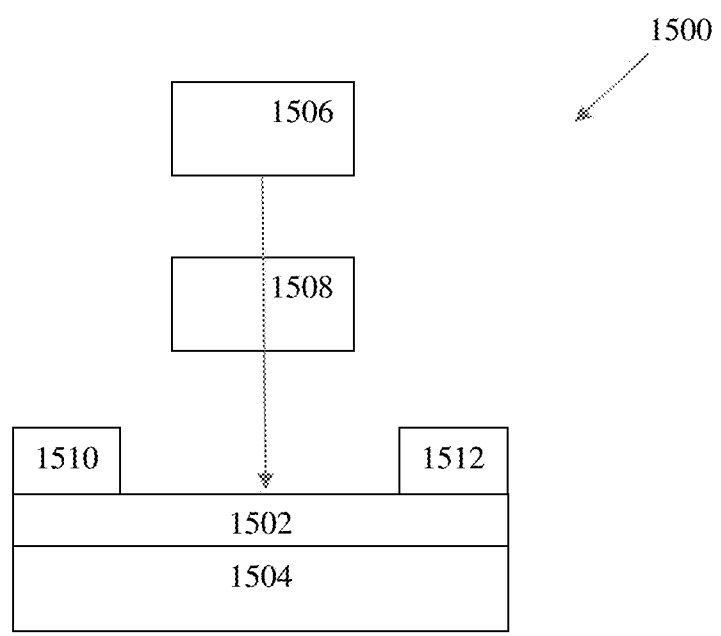
FIG. 15 illustrates a device according to some embodiments.

FIG. 15 illustrates an electronic, optoelectronic, or optical device 1500 according to some embodiments.

The device 1500 is configured as a topological switch, and includes a film 1502 of a semimetal. In some embodiments, the semimetal is a Weyl semimetal. In some embodiments, the semimetal is selected from layered transition-metal dichalcogenides, including alloys or mixed transition-metal forms thereof. In some embodiments, the semimetal is a layered transition-metal dichalcogenide that crystallizes with an orthorhombic unit cell. In some embodiments, the semimetal is $WTe_2$, $MoTe_2$, $Mo_{1-x}W_xTe_2$ with x<1, or another layered material.

In some embodiments, the film 1502 includes multiple layers of the semimetal. In some embodiments, the film 1502 has a thickness in a range of up to about 1,000 nm, up to about 900 nm, up to about 800 nm, up to about 700 nm, up to about 600 nm, up to about 500 nm, up to about 400 nm, up to about 300 nm, up to about 200 nm, or up to about 100 nm, and down to about 50 nm or less, down to about 20 nm or less, or down to about 10 nm or less.

In some embodiments, the film 1502 has a major surface (e.g., a top surface), and crystallographic axes of the Weyl semimetal (crystallographic a-axis and b-axis) are substantially parallel to the major surface of the film 1502.

In some embodiments, the device 1500 further includes a substrate 1504, and the film 1502 of the semimetal is disposed over the substrate 1504.

In some embodiments, the device 1500 further includes a pair of electrodes 1510 and 1512, and the film 1502 of the semimetal is coupled between the electrodes 1510 and 1512. In some embodiments, an electrical current is passed between the electrodes 1510 and 1512 and through the film 1502 of the semimetal.

As illustrated in FIG. 15, the device 1500 further includes a light source 1506 optically coupled to the film 1502 of the semimetal, and configured to emit a set of one or more light pulses that are directed towards the film 1502 of the semimetal.

In some embodiments, the light source 1506 is a pulsed light source, and is configured to emit the set of light pulses having a terahertz (THz) frequency in a range of about 1 THz to about 1000 THz. In some embodiments, the light source 1506 is configured to emit the set of light pulses having an infrared wavelength in a range of about 700 nm (or about 430 THz) to about 1 mm (or about 300 gigahertz (GHz)). In some embodiments, the light source 1506 is configured to emit the set of light pulses having a visible wavelength in a range of about 400 nm (or about 790 THz) to about 700 nm (or about 430 THz).

In some embodiments, the device 1500 further includes a collimator 1508 (including a set of one or more mirrors) optically coupled between the light source 1506 and the film 1502 of the semimetal, and configured to collimate the set of light pulses from the light source 1506. As illustrated, the light pulses are directed towards the film 1502 of the semimetal in a direction substantially perpendicular to the major surface of the film 1502, although the direction can be varied for other embodiments.

In some embodiments, the light source 1506 is configured to emit the light pulses having a field strength sufficient to induce interlayer shear oscillation between layers of the semimetal within the film 1502, and the interlayer shear oscillation induces the semimetal material to transition between a first topological phase and a second topological phase. In some embodiments, the field strength is about 100 kV/cm or greater, about 200 kV/cm or greater, about 400 kV/cm or greater, about 600 kV/cm or greater, about 800 kV/cm or greater, about 1 MV/cm or greater, about 2 MV/cm or greater, about 3 MV/cm or greater, about 4 MV/cm or greater, about 5 MV/cm or greater, or about 6 MV/cm or greater, and up to about 10 MV/cm or greater. In some embodiments, the second topological phase is a metastable phase that is topologically distinct from the first topological phase. In some embodiments, the interlayer shear oscillation has a frequency in a range of 0.1 THz to about 10 THz or about 0.1 THz to about 1 THz, with a strain amplitude of about 0.5% or greater, about 0.6% or greater, about 0.7% or greater, about 0.8% or greater, or about 0.9% or greater, and up to about 1% or greater. In some embodiments, wherein in transitioning between the first topological phase and the second topological phase, separation of at least some of Weyl points of the semimetal are increased (or decreased) for at least two folds (or at least 2 times). In some embodiments, wherein in transitioning between the first topological phase and the second topological phase, at least some of Weyl points of the semimetal are annihilated. In some embodiments, the Weyl points annihilated are Weyl points of opposite chirality. In some embodiments, the semimetal is transitioned between the first topological phase and the second topological phase through a time interval of one or more picoseconds (ps) (e.g., in a range of about 1 ps to about 500 ps, about 1 ps to about 200 ps, or about 1 ps to about 100 ps). In some embodiments, the transition between the first topological phase and the second topological phase is associated with a symmetry change between a non-centrosymmetric structure and a centrosymmetric structure.

Although some embodiments are explained in connection with the light source 1506, another source of stimulus can be included, such as an electrical source to impart an electrical stimulus to induce interlayer shear oscillations in the film 1502 of the semimetal.

As used herein, the singular terms "a," "an," and "the" may include plural referents unless the context clearly dictates otherwise.

In the description of some embodiments, a component provided "on" or "over" another component can encompass cases where the former component is directly adjoining (e.g., in physical contact with) the latter component, as well as cases where one or more intervening components are located between the former component and the latter component.

As used herein, the terms "approximately," "substantially" "substantial," and "about" refer to a considerable degree or extent. When used in conjunction with an event or situation, the terms can refer to instances in which the event or situation occurs precisely as well as instances in which the event or situation occurs to a close approximation, such as when accounting for typical tolerance levels of manufacturing methods described herein. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is understood that such range formats are used for convenience and brevity, and should be interpreted flexibly to include numerical values explicitly specified as limits of a range, as well as all individual numerical values or sub-ranges encompassed within that range, as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The construction and arrangement of the structures and methods as shown in the various example embodiments are illustrative only. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the example embodiments without departing from the scope of the present disclosure.

What is claimed is:

1. A method of operating a device, comprising:
providing a film of a semimetal in a first topological phase; and
inducing interlayer shear displacement of the semimetal within the film, wherein the interlayer shear displacement induces the semimetal to transition to a different, second topological phase,
wherein inducing the interlayer shear displacement includes emitting a set of pulses towards the film, the set of pulses having a field strength of 200 kV/cm or greater in the form of light pulses or electrical pulses.

2. The method of claim 1, wherein the semimetal is a Weyl semimetal.

3. The method of claim 1, wherein the semimetal is $WTe_2$, $MoTe_2$, or $Mo_{1-x}W_xTe_2$ with $x<1$.

4. The method of claim 1, wherein the set of light pulses have a terahertz frequency.

5. The method of claim 1, wherein the set of light pulses have an infrared wavelength or a visible wavelength.

6. The method of claim 1, wherein the set of light pulses have a field strength of 1 MV/cm or greater.

7. The method of claim 1, wherein the interlayer shear displacement has a frequency in a range 0.1 terahertz to 10 terahertz.

8. The method of claim 1, wherein the transition of the semimetal is associated with a symmetry change between a non-centrosymmetric structure and a centrosymmetric structure.

9. A device comprising:
a film of a semimetal; and
a light source optically coupled to the film and configured to emit a set of light pulses having a field strength of 200 kV/cm or greater, and that is sufficient to induce interlayer shear displacement of the semimetal within the film.

10. The device of claim 9, wherein the interlayer shear displacement induces the semimetal to transition between a first topological phase and a different, second topological phase.

11. The device of claim 9, further comprising a substrate, and the film is disposed over the substrate.

12. The device of claim 9, further comprising a pair of electrodes, and the film is coupled between the pair of electrodes.

13. The device of claim 9, further comprising a collimator optically coupled between the light source and the film.

14. The device of claim 9, wherein the semimetal is a Weyl semimetal.

15. The device of claim 9, wherein the semimetal is $WTe_2$, $MoTe_2$, or $Mo_{1-x}W_xTe_2$ with $x<1$.

16. The device of claim 9, wherein the light source is a pulsed, terahertz light source.

17. The device of claim 9, wherein the semimetal is $WTe_2$.

* * * * *